United States Patent [19]

Varon et al.

[11] Patent Number: 4,646,116

[45] Date of Patent: Feb. 24, 1987

[54] SEMICONDUCTOR DEVICE HAVING AN ELECTROLUMINESCENT DIODE

[75] Inventors: Jacques J. Varon, Troan; Marie-Joséphe Martin; Marc Mahieu, both of Caen, all of France

[73] Assignee: U.S. Philips Corporation, New York, N.Y.

[21] Appl. No.: 675,483

[22] Filed: Nov. 28, 1984

[30] Foreign Application Priority Data

Nov. 30, 1983 [FR] France ............................ 83 19109

[51] Int. Cl.⁴ ............................................ H01L 33/00
[52] U.S. Cl. ......................................... 357/17; 357/16; 357/63; 357/91
[58] Field of Search ....................... 357/17, 63, 16, 91

[56] References Cited

U.S. PATENT DOCUMENTS 4,414,558 11/1983 Nishizawa et al. .................. 357/17

Primary Examiner—James W. Davie
Assistant Examiner—Georgia Y. Epps
Attorney, Agent, or Firm—Robert T. Mayer; Steven R. Biren

[57] ABSTRACT

A semiconductor device includes an electroluminescent diode, which is obtained from at least one epitaxial layer of a III-V compound vapor-deposited on a substrate which is also of a III-V compound. The invention is characterized in that, preferably before the epitaxial layer is vapor deposited, a layer having a disturbed crystal structure is provided at the surface of the substrate, as a result of which the substrate does not generate radiation.

4 Claims, 2 Drawing Figures

ND_DEVICE HAVING AN
SEMICONDUCTOR DEVICE HAVING AN ELECTROLUMINESCENT DIODE

BACKGROUND OF THE INVENTION

The invention relates to a semiconductor device including an electroluminescent diode having a narrow spectral range, which comprises a monocrystalline substrate consisting of a compound of elements of the columns III and V of the Periodical System according to Mendeleev of a first conductivity type, and an epitaxial layer on this substrate and also consisting of a III-V compound and of the first conductivity type, which epitaxial layer comprises an electroluminescent pn-junction.

The invention further relates to a method of manufacturing this device.

Such a device is generally known from the published British Patent Application GB-A-No. 2070859, now British Patent No. 2,070,859, corresponding to U.S. Pat. No. 4,414,558.

Due to its very favorable properties—especially stability and quantum efficiency—, $Ga_{1-x}Al_xAs$ is the most suitable material for the manufacture of light-emitting diodes having a very high efficiency in the visible red or infrared.

However, when considering the radiation spectrum of a $Ga_{1-x}Al_xAs$ layer deposited on a GaAs substrate by means of epitaxy from the liquid phase, it is found that the maximum luminous intensity lies in the proximity of a wavelength of 800 nm, but that there exists a parasitic radiation, whose wavelength lies in the proximity of 900 nm.

In telecommunication systems comprising optical fibers, in which use is made of electroluminescent diodes and wavelength multiplexing it is necessary that the signals emitted by light sources at closely-adjacent frequencies have a narrow spectral range so that these frequencies don't overlap each other.

It stands to reason that due to the occurrence of parasitic radiation in the proximity of 900 nm in the diodes obtained from $Ga_{1-x}Al_xAs$, these diodes become practically unusable. It can be derived from experiments carried out with the diodes by the Applicant that the parasitic radiation is probably due to the luminescent properties of the GaAs substrate, the occurrence of this luminescence being due to reactivation, which is caused by the photons which are emitted by the diodes themselves during their operation. This phenomenon found in electroluminescent $Ga_{1-x}Al_xAs$/GaAs diodes can also occur in other diode types, which are made of different III-V compounds and in which the substrate is activated by the operation of the diodes, while the parasitic radiation then has a different wavelength.

SUMMARY OF THE INVENTION

The invention therefore has for its object to eliminate in all these diode types and especially in $Ga_{1-x}Al_xAs$/GaAs diodes the parasitic luminous radiation generated by the substrate.

According to the invention, a semiconductor device of the kind mentioned above is characterized in that the substrate has at the interface with the epitaxial layer a thin layer having a disturbed crystal structure in order to avoid parasitic radiation generated by the substrate.

According to a preferred embodiment, the substrate is gallium arsenide and the epitaxial layer is gallium aluminum arsenide. The layer having a disturbed crystal structure advantageously has a thickness of about 3 μm and it contains a dose of at least $5.10^{14}$ boron atoms/cm$^2$. In fact, boron has the property that it degrades the luminescent properties of the GaAs at the surface. This degradation may be accompanied by a deterioration of the conduction properties of the GaAs, but the Applicant has found that these conduction properties had been entirely restored after the thermal treatment required for the manufacture of the overlying epitaxial layer.

Otherwise, the crystallographic quality of the said epitaxial layer is not adversely affected by the ion implantation carried out beforehand on the substrate so that the electroluminescent diode obtained has a light output which is comparable with that of non-implanted diodes.

The electroluminescent pn junction is preferably situated between the epitaxial layer of the first conductivity type and an overlying second epitaxial layer of gallium aluminum arsenide of the second opposite conductivity type.

The invention further relates to a method of manufacturing the semiconductor device described. This method is characterized in that before the epitaxial layer of the first conductivity type is grown, impurities are introduced into a thin surface layer of the substrate, which do not change the conductivity type of the substrate, but which disturb the crystal structure within the surface layer.

BRIEF DESCRIPTION OF THE DRAWING

The invention will now be described more fully with reference to the accompanying drawings, in which.

It should be noted that for the sake of clarity the dimensions in the Figures are greatly exaggerated and not drawn in the correct proportions.

DESCRIPTION OF THE PREFERRED EMBODIMENT

Figure 1:
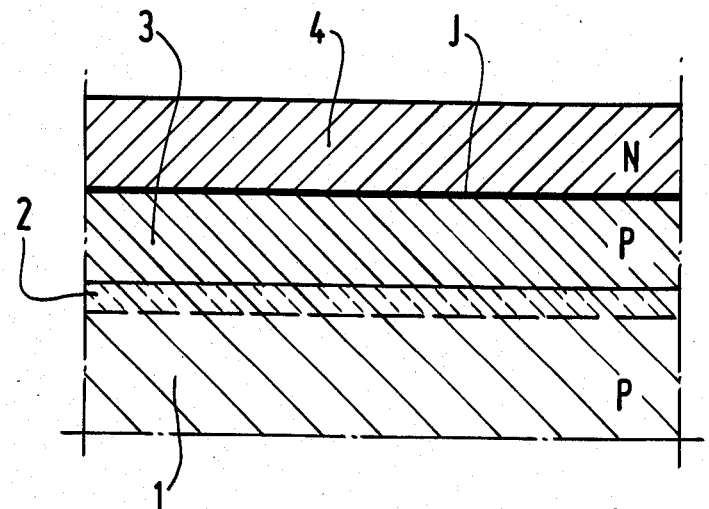
FIG. 1 shows diagrammatically and in sectional view the structure of a device according to the invention.

As shown in FIG. 1, an electroluminescent diode according to the invention comprises a GaAs substrate 1 of, for example, the p-type.

A layer of boron impurities 2 having a thickness of about 0.3 μm and a dose of at least $5.10^{14}$/cm$^2$ is formed on the said substrate 1 and this processing step is effected by means of ion implantation at an energy of 150 to 180 keV.

Subsequently, two epitaxial layers 3 and 4 of $Ga_{1-x}Al_xAs$ are successively grown on the substrate 1. The layer 3 comprises, for example, p-type $Ga_{0.9}Al_{0.1}As$, while the layer 4 comprises, for example, n-type $Ga_{0.7}Al_{0.3}As$, as a result of which an electroluminescent pn-junction J is formed with the layer 3.

Due to electrical activation of the pn-junction J, photons are produced which reactivate the substrate 1 and which in known electroluminescent devices produce a parasitic radiation.

Figure 2:
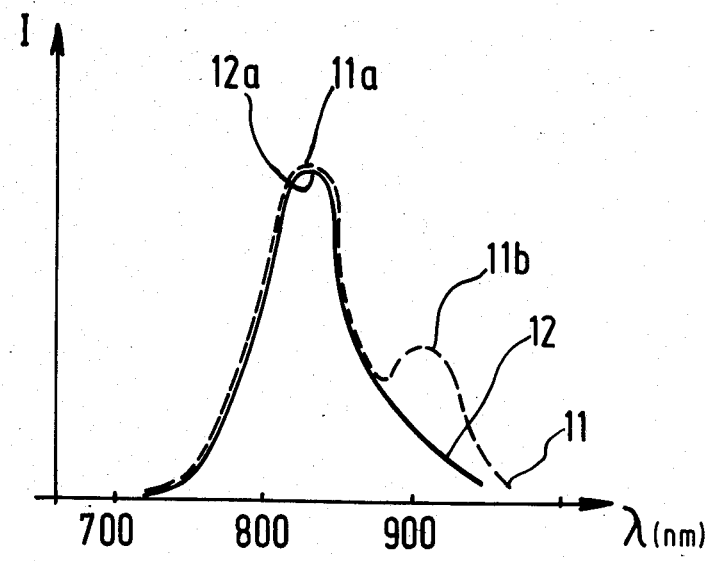
FIG. 2 shows the diagram of the luminous spectrum of a known electroluminescent diode as compared with a diode according to the invention.

This phenomenon is indicated diagrammatically by a curve 11 in the diagram $I=f(\lambda)$ of FIG. 2 (in which the current I is expressed in arbitrary units). According to this Figure, the curve 11 has a first maximum 11a corresponding to the normal radiation of the electroluminescent junction (about 830 nm) and a second maximum 11b corresponding to the parasitic radiation (in the proximity of 900 nm).

By the use of the invention, the spectrum of the electroluminescent diode is reduced to the curve 12, which has only one maximum 12a which coincides with the maximum 11a of the curve 11, the parasitic radiation being avoided due to the presence of the layer 2 having a crystal structure disturbed by boron impurities.

Experiments carried out with a boron implantation at a dose of $5.10^{15}$ cm$^{-2}$ and an energy of 180 keV showed that the parasitic radiation could be reduced by a factor 15 to 25 within a temperature range of from 80° K. to 300° K.

What is claimed is:

1. A semiconductor device including an electroluminescent diode having a narrow spectral range, which comprises a monocrystalline substrate of a III-V compound of a first conductivity type, a first epitaxial layer of a III-V compound of a first conductivity type formed on said substrate, a second epitaxial layer of a III-V compound of a second conductivity type formed on said first epitaxial layer, an electroluminescent p-n junction formed between said epitaxial layers, a thin layer having a crystal structure disturbed by boron impurities formed at the surface of the substrate that interfaces said first epitaxial layer to avoid parasitic radiation generated by the substrate, and electrode means for contacting said electroluminescent diode.

2. A semiconductor device as claimed in claim 1, characterized in that the substrate comprises gallium arsenide and the epitaxial layers comprise gallium aluminum arsenide.

3. A semiconductor device as claimed in claim 2, characterized in that the layer having a disturbed crystal structure has a thickness of about 0.3 μm and contains a dose of at least $5.10^{14}$ boron atoms/cm$^2$.

4. A semiconductor device as claimed in claim 3, characterized in that the electroluminescent p-n junction is situated between the first epitaxial layer, which is of the first conductivity type, and the overlying second epitaxial layer, which is of gallium aluminum arsenide and is of the second, opposite conductivity type.

* * * * *